(12) United States Patent
Kurita et al.

(10) Patent No.: US 8,035,231 B2
(45) Date of Patent: *Oct. 11, 2011

(54) SEMICONDUCTOR DEVICE AND METHOD OF MANUFACTURING THE SAME

(75) Inventors: Yoichiro Kurita, Kanagawa (JP); Masaya Kawano, Kanagawa (JP); Koji Soejima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 547 days.

This patent is subject to a terminal disclaimer.

(21) Appl. No.: 12/114,238

(22) Filed: May 2, 2008

(65) Prior Publication Data
US 2008/0203565 A1 Aug. 28, 2008

Related U.S. Application Data

(62) Division of application No. 11/393,686, filed on Mar. 31, 2006, now Pat. No. 7,927,999.

(30) Foreign Application Priority Data

Apr. 6, 2005 (JP) .................................. 2005-109993

(51) Int. Cl.
*H01L 23/48* (2006.01)
(52) U.S. Cl. . 257/774; 257/737; 257/775; 257/E23.011; 257/E23.019
(58) Field of Classification Search .................. 174/250, 174/255, 256; 257/774, E23.011, E23.067, 257/E23.145, E21.578, 737, 775, E23.019
See application file for complete search history.

(56) References Cited

U.S. PATENT DOCUMENTS

| | | | |
|---|---|---|---|
| 6,486,394 B1 * | 11/2002 | Schmidt et al. | 174/36 |
| 6,534,723 B1 * | 3/2003 | Asai et al. | 174/255 |
| 6,680,540 B2 * | 1/2004 | Nakano et al. | 257/758 |
| 6,828,510 B1 * | 12/2004 | Asai et al. | 174/255 |
| 7,238,603 B2 * | 7/2007 | Iijima et al. | 438/613 |
| 7,279,408 B2 * | 10/2007 | Inoue et al. | 438/597 |
| 7,378,602 B2 * | 5/2008 | Ikeda | 174/262 |
| 7,622,183 B2 * | 11/2009 | Shirai et al. | 428/209 |
| 2004/0056344 A1 * | 3/2004 | Ogawa et al. | 257/686 |

(Continued)

FOREIGN PATENT DOCUMENTS

JP 62-229899 10/1987

(Continued)

OTHER PUBLICATIONS

Japanese Official Action—2005-109993—Sep. 16, 2010.

*Primary Examiner* — Matthew Landau
*Assistant Examiner* — Joseph C Nicely
(74) *Attorney, Agent, or Firm* — Young & Thompson (57) ABSTRACT

The semiconductor device 1 includes interconnect layers 10, 20, an IC chip 30, via plugs 42, 44, a seal resin 50, and solder balls 60. The interconnect layer 10 includes a via plug 42. An end face of the via plug 42 on the side of the interconnect layer 20 is smaller in area than the opposite end face, i.e. the end face on the side of the IC chip 30. An end face of the via plug 44 on the side of the interconnect layer 10 is smaller in area than the opposite end face, i.e. the end face on the side of the solder balls 60. The thermal decomposition temperature of the insulating resin 14 constituting the interconnect layer 10 is higher than that of the insulating resin 24 constituting the interconnect layer 20.

4 Claims, 13 Drawing Sheets

U.S. PATENT DOCUMENTS

| | | | |
|---|---|---|---|
| 2005/0056942 A1* | 3/2005 | Pogge et al. | 257/778 |
| 2007/0184604 A1* | 8/2007 | Honda | 438/206 |
| 2009/0111206 A1* | 4/2009 | Luch | 438/59 |
| 2010/0117236 A1* | 5/2010 | Lin et al. | 257/753 |

FOREIGN PATENT DOCUMENTS

| | | |
|---|---|---|
| JP | 01-143394 | 6/1989 |
| JP | 2002-343931 | 11/2002 |
| JP | 2003-309215 | 10/2003 |
| JP | 2004-039867 | 2/2004 |
| JP | 2004-265967 | 9/2004 |
| JP | 2005-063987 | 3/2005 |

* cited by examiner

SEMICONDUCTOR DEVICE AND METHOD OF MANUFACTURING THE SAME

This application is based on Japanese patent application NO. 2005-109993, the content of which is incorporated hereinto by reference.

BACKGROUND

1. Technical Field

The present invention relates to a semiconductor device and a method of manufacturing the same.

2. Related Art

Methods of manufacturing a semiconductor device known in the industry include the one disclosed in Japanese Laid-open patent publication NO. 2003-309215 (Patent Document 1). According to the method of manufacturing disclosed therein, a plurality of interconnect layers is sequentially stacked on a supporting substrate thus to form a multilayer interconnect structure, after which the supporting substrate is removed. Then on a surface of the multilayer interconnect structure exposed upon removal of the supporting substrate, solder balls are formed which are to serve as external electrode terminals. On the opposite surface of the multilayer interconnect structure, a semiconductor chip is mounted by flip-chip bonding. This leads to formation of a semiconductor device including the semiconductor chip mounted on the multilayer interconnect structure.

SUMMARY OF THE INVENTION

When forming such semiconductor device, a resin appropriate for fine-scale processing has to be employed on the interconnect layer that faces the semiconductor chip among those constituting the multilayer interconnect structure, for achieving fine-scale connection between the interconnect layer and the semiconductor chip. In contrast, employing the resin appropriate for fine-scale processing is often unnecessary on the interconnect layer that faces the solder balls. As such, it is desirable to employ a relatively inexpensive resin on the interconnect layer facing the solder balls, from the viewpoint of reduction in manufacturing cost of the semiconductor device.

By the method of manufacturing according to Patent Document 1, however, the interconnect layers are sequentially stacked on the supporting substrate, for constituting the multilayer interconnect structure. Accordingly, the interconnect layer on the side of the solder balls is formed before the formation of the interconnect layer on the side of the semiconductor chip. This imposes a restriction that a resin constituting the interconnect layer on the solder balls side should not have a lower thermal decomposition temperature than a resin constituting the interconnect layer on the semiconductor chip side. Such restriction considerably reduces the selection range of the resin that can be employed for the interconnect layer on the solder balls side, thereby impeding the attempt of lowering the manufacturing cost of the semiconductor device.

According to the present invention, there is provided a method of manufacturing a semiconductor device, comprising forming a first interconnect layer on a supporting substrate; mounting a semiconductor chip on a first surface of the first interconnect layer; removing the supporting substrate after the mounting of the semiconductor chip; and forming a second interconnect layer on a second surface of the first interconnect layer opposite to the first surface, after the removing of the supporting substrate.

The method of manufacturing thus arranged specifies forming the first interconnect layer, on which the semiconductor chip is to be mounted, on the supporting substrate, while forming the second interconnect layer after the removal of the supporting substrate. Such method removes the restriction against the use of a resin having a lower thermal decomposition temperature than a resin constituting the first interconnect layer, for constituting the second interconnect layer. Therefore, the method allows employing a resin appropriate for fine-scale processing for the first interconnect layer, while employing a relatively inexpensive resin for the second interconnect layer.

According to the present invention, there is provided a semiconductor device comprising a first interconnect layer; a semiconductor chip mounted on a first surface of the first interconnect layer; a second interconnect layer provided on a second surface of the first interconnect layer opposite to the first surface; a first conductive plug provided in the first interconnect layer; and a second conductive plug provided in the second interconnect layer; wherein an end face of the first conductive plug facing the second interconnect layer is smaller in area than the opposite end face of the first conductive plug; an end face of the second conductive plug facing the first interconnect layer is smaller in area than the opposite end face of the second conductive plug; and a resin constituting the first interconnect layer has a higher thermal decomposition temperature than a resin constituting the second interconnect layer.

The semiconductor device thus constructed permits use of a resin having a lower thermal decomposition temperature than a resin constituting the first interconnect layer, for constituting the second interconnect layer. Such semiconductor device allows employing a resin appropriate for fine-scale processing for the first interconnect layer, while employing a relatively inexpensive resin for the second interconnect layer.

The present invention provides a semiconductor device that can be manufactured at a lower cost, yet allows achieving fine-scale connection between an interconnect layer and a semiconductor chip, and a method of manufacturing such semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the identical numerals, and duplicating description will be omitted.

First Embodiment

Figure 1:
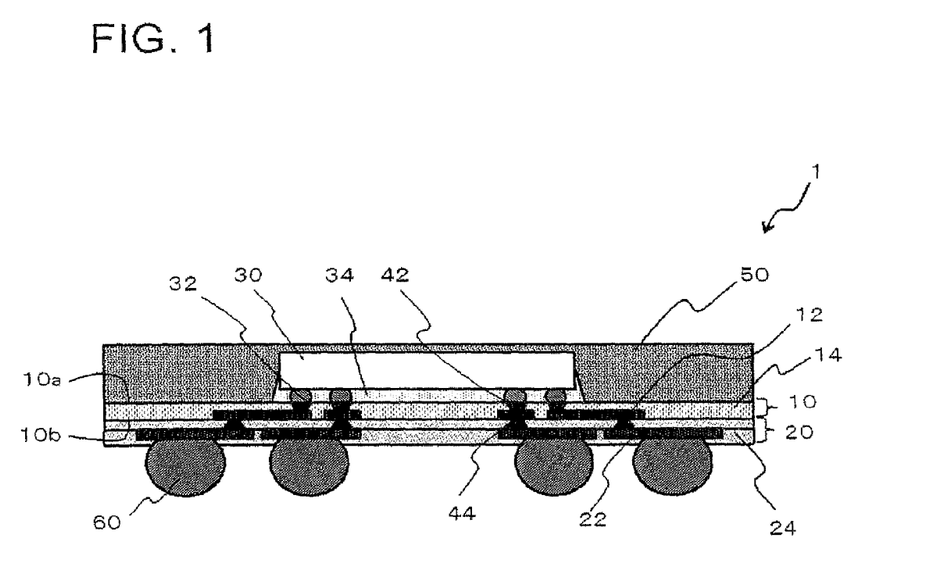
FIG. 1 is a schematic cross-sectional view showing a semiconductor device according to the first embodiment of the present invention.

FIG. 1 is a schematic cross-sectional view showing a semiconductor device according to the first embodiment of the present invention. The semiconductor device 1 includes interconnect layers 10, 20, an IC chip 30, via plugs 42, 44, a seal resin 50, and solder balls 60. In the semiconductor device 1, the IC chip 30, the interconnect layer 10 and the interconnect layer 20 are stacked in this sequence and electrically connected to one another. In other words, the IC chip 30 is mounted on a first surface 10a of the interconnect layer 10, and the interconnect layer 20 is provided on a second surface lob of the interconnect layer 10, opposite to the first surface 10a.

The interconnect layer 10 (first interconnect layer) includes a conductor interconnect 12 (first interconnect) and an insulating resin 14. The conductor interconnect 12 is buried in a part of the surface layer of the insulating resin 14 facing the interconnect layer 20. Examples of a conductive material employed as the conductor interconnect 12 include Cu, Ni, Au, and Ag. The insulating resin 14 may be a PBO (polybenzooxazole) or a polyimide resin. The polyimide resin may be photosensitive or non-photosensitive.

The interconnect layer 10 also includes the via plug 42 (first conductive plug). The via plug 42 extends from the conductor interconnect 12 to the first surface 10a. Accordingly, an end of the via plug 42 is connected to the conductor interconnect 12, and the other end is exposed on the first surface 10a of the interconnect layer 10. Also, as is apparent from FIG. 1, the end face of the via plug 42 on the side of the interconnect layer 20 is smaller in area than the opposite end face, i.e. the end face on the side of the IC chip 30. The via plug 42 serves to electrically connect the interconnect layer 10 and the IC chip 30.

The interconnect layer 20 (second interconnect layer) includes a conductor interconnect 22 (second interconnect) and an insulating resin 24. The conductor interconnect 22 is buried in the insulating resin 24. Examples of a conductive material employed as the conductor interconnect 12 include Cu, Ni, Au, and Ag. The insulating resin 24 may be a non-photosensitive resin such as an epoxy resin. The interconnect structure constituted of the interconnect layer 10 and the interconnect layer 20 serves as an interposer in the semiconductor device 1.

The thermal decomposition temperature of the insulating resin 14 constituting the interconnect layer 10 is higher than that of the insulating resin 24 constituting the interconnect layer 20. When the PBO is employed as the insulating resin 14, the thermal decomposition temperature is 540 degree centigrade or so. When the epoxy resin is employed as the insulating resin 24, the thermal decomposition temperature is 310 degree centigrade or so. The thermal decomposition temperature herein refers to a temperature at which the weight of the resin is reduced by 5 wt. %, when measured by a thermo balance at a heating speed of 10 degree centigrade per minute.

The interconnect layer 20 also includes the via plug 44 (second conductive plug). The via plug 44 extends from the conductor interconnect 12 to the conductor interconnect 22. Accordingly, an end of the via plug 44 is connected to the conductor interconnect 12, and the other end is connected to the conductor interconnect 22. Also, as is apparent from FIG. 1, the end face of the via plug 44 on the side of the interconnect layer 10 is smaller in area than the opposite end face, i.e. the end face on the side of the solder balls 60. The via plug 44 serves to electrically connect the interconnect layer 10 and the interconnect layer 20.

Here, the minimum interval between the via plugs 42 is narrower than the minimum interval between the via plugs 44. The interval between the via plugs herein refers to a distance between a center line (straight line passing through the center of the both end faces of the via plug) of the respective via plugs. Accordingly, the minimum interval between the via plugs means the interval between two closest via plugs.

The IC chip 30 (semiconductor chip) is mounted by flip-chip bonding on the first surface 10a of the interconnect layer 10. More specifically, the IC chip 30 is fixed to the interconnect layer 10 by solder balls 32 connected to the via plug 42. Between the interconnect layer 10 and the IC chip 30, an underfill resin 34 is provided.

On the first surface 10a of the interconnect layer 10, a seal resin 50 is provided so as to cover a side face of the IC chip 30. In this embodiment, the seal resin 50 covers not only the side face of the IC chip 30, but also the upper surface thereof (surface opposite to the interconnect layer 10).

To the surface of the interconnect layer 20 opposite to the interconnect layer 10, the solder balls 60 are connected. To be more detailed, the solder balls 60 are respectively connected to the conductor interconnect 22 at an end portion. Accordingly, a portion of each solder ball 60 is buried in the interconnect layer 20. The solder balls 60 serve as an external connection terminal of the semiconductor device 1.

Figure 2:
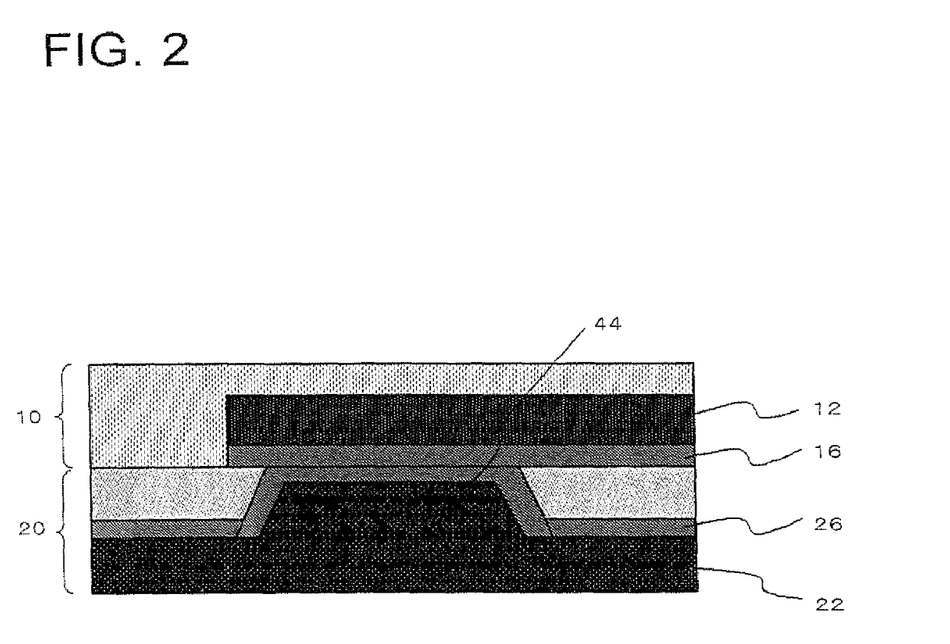
FIG. 2 is a cross-sectional view showing a portion around an interface between the first interconnect layer and the second interconnect layer.

Referring to FIG. 2, a structure around the interface between the interconnect layer 10 and the interconnect layer 20 will be described. In this embodiment, an adhesion metal film 16 is provided on the surface of the conductor interconnect 12 facing the interconnect layer 20. Another adhesion metal film 26 is provided on the surface of the conductor interconnect 22 facing the interconnect layer 10. The adhesion metal film 26 is disposed so as to cover the via plug 44. The adhesion metal film 16 and the adhesion metal film 26 are in mutual contact on the via plug 44. The adhesion metal film 16 is, for instance, a Ni film. The adhesion metal film 26 is, for instance, a multilayer metal film (Ti/Ni film) constituted of a Ti film provided on the side of the interconnect layer 10 and a Ni film provided on the side of the conductor interconnect 22.

Figure 3A:
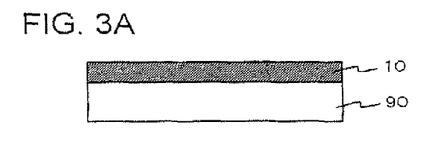
FIGS. 3A to 3E are schematic cross-sectional views for explaining a method of manufacturing the semiconductor device according to the first embodiment.

Now referring to FIGS. 3A through 8B, detailed description will be given on a method of manufacturing the semiconductor device 1, which corresponds to the first embodiment of the method of manufacturing the semiconductor device according to the present invention. Prior to the detailed description, an outline of the manufacturing method according to this embodiment will be described referring to FIGS. 3A to 3E. As shown in FIG. 3A, firstly the interconnect layer 10 is formed on a supporting substrate 90 (first interconnect layer formation step). In this embodiment, the supporting substrate 90 is a silicon substrate.

Figure 3B:
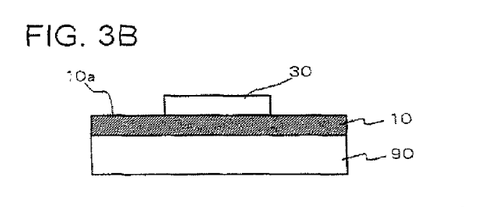
Figure 3C:
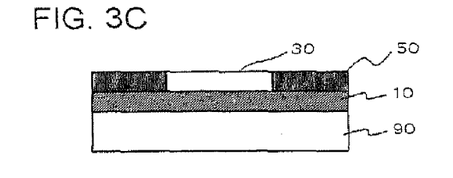
Figure 3D:
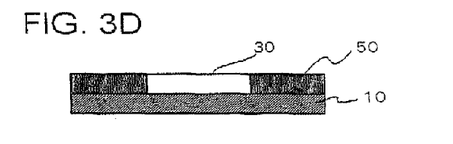
Figure 3E:
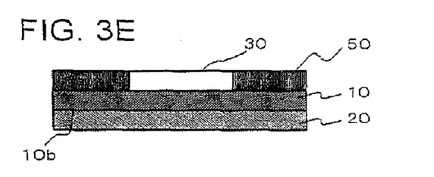

Proceeding to FIG. 3B, the IC chip 30 is mounted on the first surface 10a of the interconnect layer 10 (semiconductor chip mounting step). Then as shown in FIG. 3C, the seal resin 50 is provided on the interconnect layer 10 so as to cover the side face of the IC chip 30 (seal resin formation step). FIG. 3D shows a state that the supporting substrate 90 has been removed (supporting substrate removal step). Further as shown in FIG. 3E, the interconnect layer 20 is formed on the second surface lob of the interconnect layer 10 (second interconnect layer formation step). Finally, though not shown in the drawing, the solder balls 60 are formed, thereby completing the manufacturing of the semiconductor device 1 shown in FIG. 1.

In this embodiment, the first interconnect layer formation step includes the first interconnect formation step and the first conductive plug formation step, which will be subsequently described, and the second interconnect layer formation step includes the second conductive plug formation step and the second interconnect formation step to be subsequently described. In the second interconnect layer formation step, a resin having a lower thermal decomposition temperature is employed as the insulating resin 24 constituting the interconnect layer 20, than a resin employed in the first interconnect layer formation step as the insulating resin 14 constituting the interconnect layer 10.

Figure 4A:
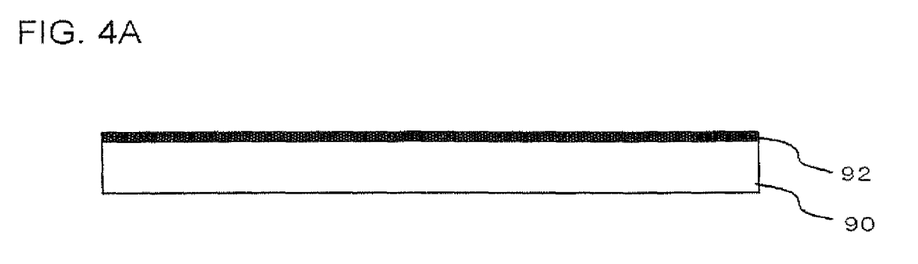
FIGS. 4A and 4B are schematic cross-sectional views for explaining a method of manufacturing the semiconductor device according to the first embodiment.
Figure 4B:
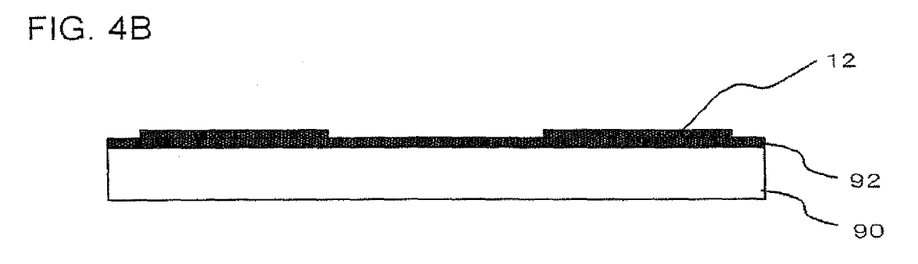

Referring now to FIGS. 4A through 8B, the foregoing manufacturing method will be described in details. Firstly, a metal thin film 92, which serves as a seed metal for plating, is formed on the supporting substrate 90 by sputtering or the like (FIG. 4A). After forming a plating resist on the metal thin film 92, a pattern is delineated by photolithography for example. Then plating is performed utilizing the seed metal layer as a feeding layer, to form a conductor pattern which is to constitute the conductor interconnect 12 (first interconnect formation step) (FIG. 4B).

Figure 5A:
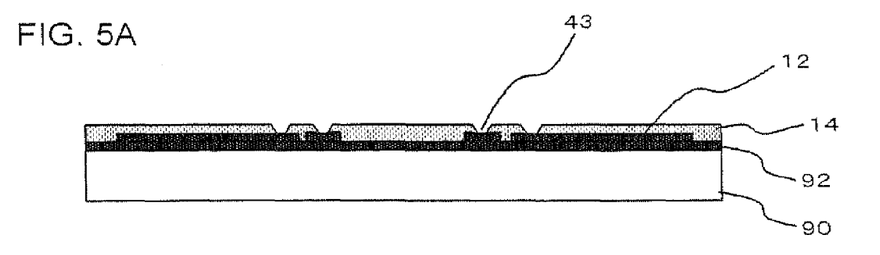
FIGS. 5A and 5B are schematic cross-sectional views for explaining a method of manufacturing the semiconductor device according to the first embodiment.
Figure 5B:
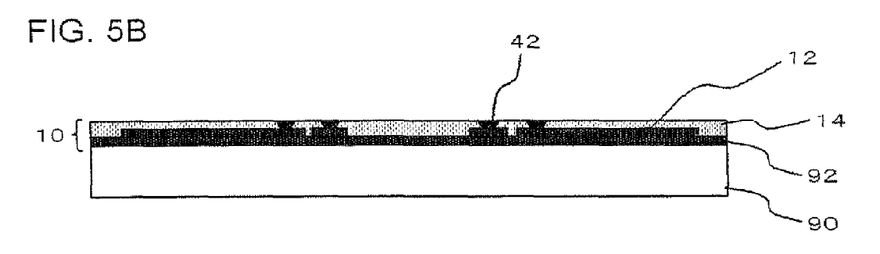

After removing the plating resist, the insulating resin 14 is provided so as to cover the conductor interconnect 12 that has just been formed. Then a via hole 43 is formed by photolithography or the like at a predetermined position of the insulating resin 14, where the via plug 42 is to be formed (FIG. 5A). Then plating is performed to fill the via hole 43 utilizing the seed metal layer as a feeding layer, thus to form the via plug 42 (first conductive plug formation step). At this stage, the interconnect layer 10 is obtained on the supporting substrate 90 (FIG. 5B).

Figure 6A:
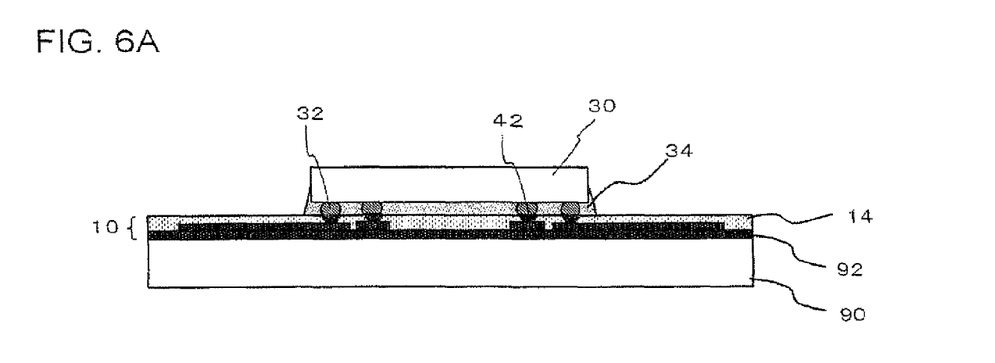
FIGS. 6A and 6B are schematic cross-sectional views for explaining a method of manufacturing the semiconductor device according to the first embodiment.
Figure 6B:
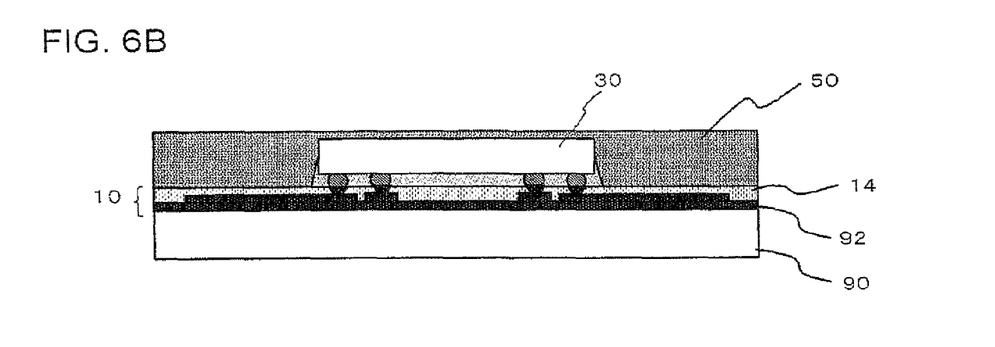

Thereafter, electrodes (solder balls 32) of the IC chip 30 are connected to the via plug 42 on the supporting substrate 90, at a fine pitch. The region between the IC chip 30 and the interconnect layer 10 is filled with the underfill resin 34, which is then cured (FIG. 6A). Then the seal resin 50 is provided on the interconnect layer 10 so as to cover the IC chip 30. At this stage, interconnect layer 10 and the side face of the IC chip 30 are covered with the seal resin 50 (FIG. 6B).

Figure 7A:
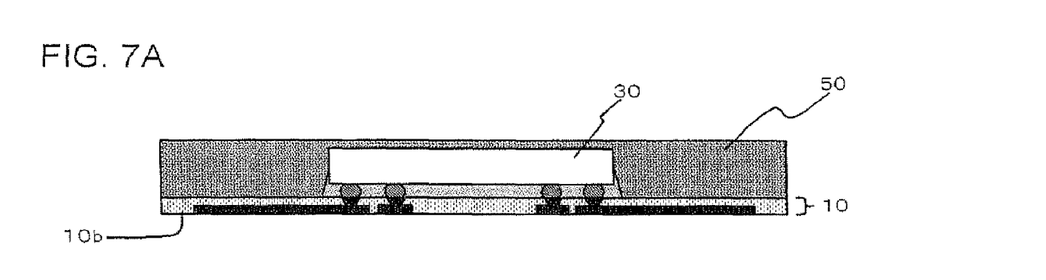
FIGS. 7A and 7B are schematic cross-sectional views for explaining a method of manufacturing the semiconductor device according to the first embodiment.
Figure 7B:
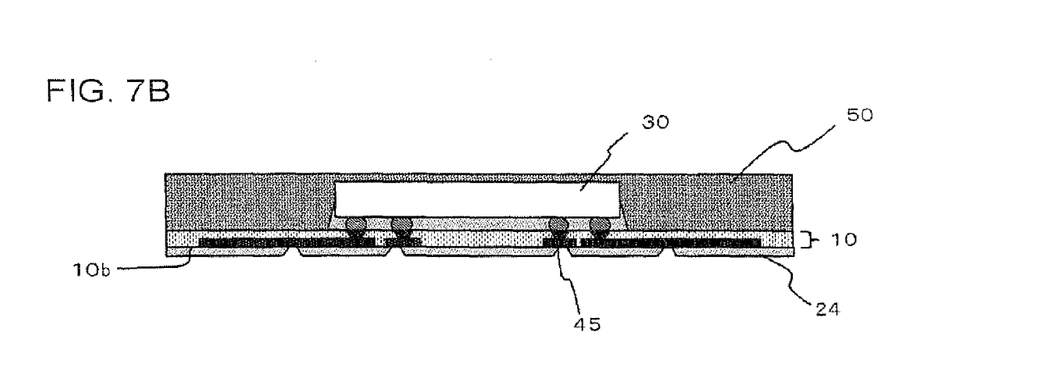

Then the supporting substrate 90 is removed, and etching is performed to remove the metal thin film 92 (FIG. 7A). On the second surface 10b of the interconnect layer 10, now exposed because of the above removal, a portion of the insulating resin 24 is provided. Also, a via hole 45 is formed with a laser or the like, at a predetermined position of the insulating resin 24 where the via plug 44 is to be formed (FIG. 7B).

Figure 8A:
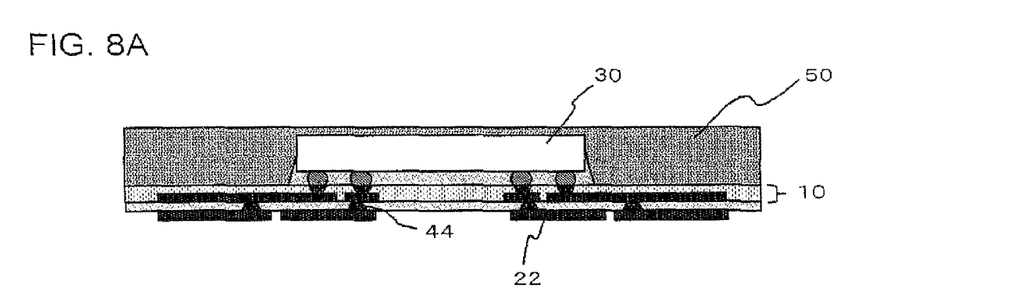
FIGS. 8A and 8B are schematic cross-sectional views for explaining a method of manufacturing the semiconductor device according to the first embodiment.
Figure 8B:
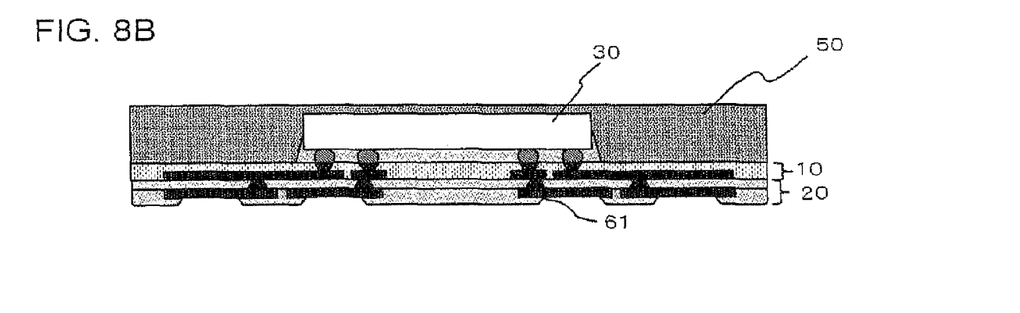

The via plug 44 is then formed in the via hole 45 (second conductive plug formation step). After that, a conductor pattern which is to constitute the conductor interconnect 22 is formed on the insulating resin 24 that has been halfway formed (second interconnect formation step) (FIG. 8A). Then the insulating resin 24 is fully formed. This process also includes forming openings 61 for the solder balls 60 at predetermined positions of the insulating resin 24. At this stage, the interconnect layer 20 is obtained on the interconnect layer 10 (FIG. 8B). Finally the solder balls 60 are formed so as to fill in the openings 61, thereby completing the manufacturing of the semiconductor device 1 shown in FIG. 1.

As is understood from the foregoing description, the interconnect layers 10, 20 are built up in an upward and downward direction respectively, in the relevant drawings. Accordingly, the end face of the via plug 42 on the side of the IC chip 30 is larger in area than the end face thereof on the side of the interconnect layer 20, and the end face of the via plug 44 on the side of the solder balls 60 is larger in area than the end face thereof on the side of the interconnect layer 10.

This embodiment offers the following advantageous effects. In the foregoing method of manufacturing includes forming the interconnect layer 10, on which the IC chip 30 is to be mounted, on the supporting substrate 90, while forming the interconnect layer 20 after the removal of the supporting substrate 90. Such method removes the restriction against the use of a resin having a lower thermal decomposition temperature than the insulating resin 14, as the insulating resin 24. Therefore, the method allows employing a resin appropriate for fine-scale processing as the insulating resin 14, while employing a relatively inexpensive resin as the insulating resin 24. Thus the foregoing embodiment provides a method of manufacturing the semiconductor device 1 that can be manufactured at a lower cost, yet allows achieving fine-scale connection between the interconnect layer 10 and the IC chip 30.

The interconnect pattern of the conductor interconnect 12 is formed on the sufficiently rigid supporting substrate 90, which permits the formation of the conductor interconnect 12 in a fine pattern. Also, since the interconnect layer 10 and the IC chip 30 are bonded on the supporting substrate 90, the interconnect layer 10 and the IC chip 30 can be connected via the bumps at a fine pitch. This leads to reduction in the number of the interconnect layers, as well as in dimensions of the IC chip 30.

Also, the insulating resin 24 constituting the interconnect layer 20 can be made thicker than the insulating resin 14, because the interconnect layer 20 is formed after the removal of the supporting substrate 90. This enhances the stress relief performance of the insulating resin 24, thus resulting in upgraded reliability of the semiconductor device 1.

In the second interconnect layer formation step, a resin, having a lower thermal decomposition temperature than the insulating resin 14 constituting the interconnect layer 10 formed in the first interconnect layer formation step, is employed as the insulating resin 24 constituting the interconnect layer 20. Such arrangement allows properly forming the interconnect layer 20 on the interconnect layer 10.

The first interconnect layer formation step includes the first interconnect formation step and the first conductive plug formation step. Likewise, the second interconnect layer formation step includes the second conductive plug formation step and the second interconnect formation step. Such method allows achieving the semiconductor device 1 that includes a multilayer interconnect structure including the conductor interconnects 12, 22.

In the semiconductor device 1, a resin having a lower thermal decomposition temperature than the insulating resin 14 constituting the interconnect layer 10 can be employed as the insulating resin 24 constituting the interconnect layer 20. Accordingly, the semiconductor device 1 allows employing a resin appropriate for fine-scale processing as the insulating resin 14, while employing a relatively inexpensive resin as the insulating resin 24. Thus, the semiconductor device 1 can be manufactured at a lower cost, yet allows achieving fine-scale connection between the interconnect layer 10 and the IC chip 30.

Further, in the semiconductor device 1, the interconnect layer 10 and the interconnect layer 20 are in direct contact with each other, without intermediation by a core layer. A via plug formed in the core layer is generally more difficult to micronize than a via plug formed in an ordinary interconnect layer, and hence may restrain the micronization of the semiconductor device as a whole. However, since the semiconductor device 1 does not include any core layer, the semiconductor device 1 can remain free from such problem.

The interconnect layers 10, 20 respectively include the conductor interconnects 12, 22. In addition, the via plug 42 extends from the conductor interconnect 12 to the first surface 10a of the interconnect layer 10, while the via plug extends from the conductor interconnect 12 to the conductor interconnect 22. Such configuration achieves the semiconductor device 1 that includes a multilayer interconnect structure including the conductor interconnects 12, 22.

The seal resin 50 is provided so as to cover the side face of the IC chip 30. This assures that the physical structure of the interconnect layers is maintained even after the removal of the supporting substrate 90. Accordingly, the solder balls 60 can be formed with high coplanarity. Here, providing the seal resin 50 (and the seal resin formation step) is not imperative.

A silicon substrate is employed as the supporting substrate 90. Accordingly, impact of thermal expansion can be reduced, in comparison with an insulating substrate. This facilitates further micronization in the connection of the interconnect layer 10 and the IC chip 30.

The minimum interval between the via plugs 42 is narrower than the minimum interval between the via plugs 44. Under such configuration, while a resin appropriate for fine-scale processing should be employed as the insulating resin 14, it is not necessary to employ such a resin as the insulating resin 24. Accordingly, a relatively inexpensive resin such as an epoxy resin may be employed as the insulating resin 24.

Employing for example a PBO or a polyimide resin as the insulating resin 14 results in formation of the insulating resin 14 appropriate for fine-scale processing. On the other hand, employing the epoxy resin as the insulating resin 24 leads to formation of the insulating resin 24 at a low cost.

The adhesion metal film 16 is provided on the surface of the conductor interconnect 12 on the side of the interconnect layer 20. Likewise, the adhesion metal film 26 is provided on the surface of the conductor interconnect 22 on the side of the interconnect layer 10 (Ref. FIG. 2). Such configuration causes the resin between the conductor interconnect 12 and the conductor interconnect 22 to be held by the adhesion metal films 16, 26, thereby achieving firm adhesion between the resin and the conductor interconnects 12, 22. This leads to higher reliability of the semiconductor device 1. Here, providing the adhesion metal films 16, 26 is not imperative.

The adhesion metal film 26 is provided so as to cover the via plug 44, thus to be in contact with the adhesion metal film 16 on the via plug 44. Such direct contact between the adhesion metal films 16, 26 achieves firm adhesion between the interconnect layer 10 and the interconnect layer 20.

When the adhesion metal films 16, 26 contain Ni, the adhesion effect to the resin is further enhanced.

Second Embodiment

Figure 9:
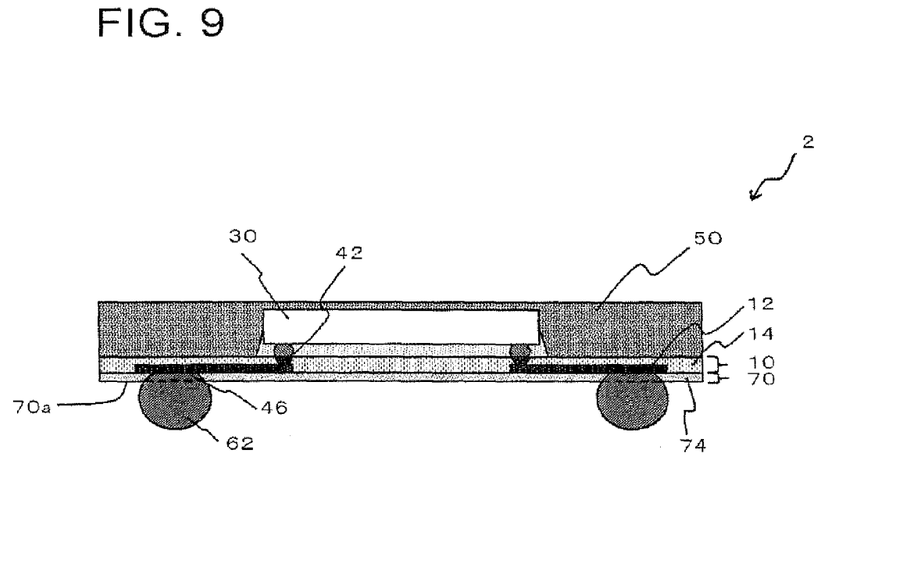
FIG. 9 is a schematic cross-sectional view showing a semiconductor device according to the second embodiment of the present invention.

FIG. 9 is a schematic cross-sectional view showing a semiconductor device according to the second embodiment of the present invention. The semiconductor device 2 includes interconnect layers 10, 70, an IC chip 30, via plugs 42, 46, a seal resin 50, and solder balls 62, among which the interconnect layer 10, the IC chip 30, the via plug 42 and the seal resin 50 are of the similar structure to those described referring to FIG. 1. In the semiconductor device 2, the IC chip 30, the interconnect layer 10 and the interconnect layer 70 are stacked in this sequence, and electrically connected to one another.

The interconnect layer 70 (second interconnect layer) includes an insulating resin 74. On the other hand, the interconnect layer 70 is different from the interconnect layer 20 shown in FIG. 1 in not including the conductor interconnect. The insulating resin 74 is constituted of a resin having a lower thermal decomposition temperature than the insulating resin 14.

The interconnect layer 70 includes the via plug 46 (second conductive plug). The via plug 46 corresponds to a portion of the solder ball 62 to be subsequently described, specifically the portion of the solder ball 62 buried in the insulating resin 74. The via plug 46 extends from the conductor interconnect 12 to a surface 70a of the interconnect layer 70 opposite to the interconnect layer 10. Also, as is apparent from FIG. 9, the end face of the via plug 46 on the side of the interconnect layer 10 is smaller in area than the opposite end face.

To the face of the interconnect layer 70 opposite to the interconnect layer 10, the solder balls 62 are connected. More specifically, the solder balls 62 penetrate through the interconnect layer 70, so that an end portion thereof is connected to the conductor interconnect 12. Accordingly, a portion of the solder ball 62 is buried in the interconnect layer 70, thus constituting the via plug 46. The remaining portion of the solder ball 62, i.e. the portion protruding out of the interconnect layer 70 constitutes a bump in the semiconductor device 2. In other words, the bump is provided on the side of the via plug 46 opposite to the interconnect layer 10, in a body with the via plug 46. The via plug 46 and the bump are constituted of an identical metal material. The bump serves as an external connection terminal of the semiconductor device 2.

A method of manufacturing the semiconductor device 2 thus configured includes a first interconnect layer formation step, a semiconductor chip mounting step, a seal resin formation step, a supporting substrate removal step and a second interconnect layer formation step. The execution sequence of these steps is similar to that of the manufacturing method described referring to FIGS. 3A to 8B. Also, among these steps, actual processes in the first interconnect layer formation step, the semiconductor chip mounting step, the seal resin formation step and the supporting substrate removal step among these steps are similar to those of the manufacturing method described referring to FIGS. 3A to 8B.

In the second interconnect layer formation step according to this embodiment, the insulating resin 74 is provided on the interconnect layer 10 (Ref. FIG. 7A) exposed upon removal of the supporting substrate 90. This process also includes forming openings for the solder balls 62 at predetermined positions of the insulating resin 74. At this stage, the interconnect layer 70 is obtained on the interconnect layer 10. Then upon forming the solder balls 62 so as to fill in the openings, the via plug 46 is obtained (second conductive plug formation step). In this process, the bumps are simultaneously formed with the via plug 46. Accordingly, the second conductive plug formation step includes forming the bumps on the opposite side of the via plug 46 to the interconnect layer 10. As is apparent from the above, each of the via plugs 46 and the bumps are integrally formed. That is how the semiconductor device 2 shown in FIG. 9 is obtained. Thus, the second interconnect layer formation step according to this embodiment only includes the former, out of the second conductive plug formation step and the second interconnect formation step.

This embodiment offers the following advantageous effects, in addition to those offered by the foregoing embodiment. The first interconnect layer formation step includes the first interconnect formation step and the first conductive plug formation step. The second interconnect layer formation step includes the second conductive plug formation step. Such method eliminates the need to form the conductor interconnect in the interconnect layer 70, thereby permitting use of a resin merely intended for the function of solder resist, as the insulating resin 74. For example, a printed non-photosensitive resin may be employed. This contributes to further reduction in manufacturing cost of the semiconductor device 2.

The interconnect layer 10 includes the conductor interconnect 12. The via plug 42 extends from the conductor interconnect 12 to the first surface 10a of the interconnect layer 10, while the via plug 46 extends from the conductor interconnect 12 to the surface 701a of the interconnect layer 70. Such configuration eliminates the need to form the conductor interconnect in the interconnect layer 70, thereby permitting use of a resin merely intended for the function of solder resist, as the insulating resin 74.

Figure 10:
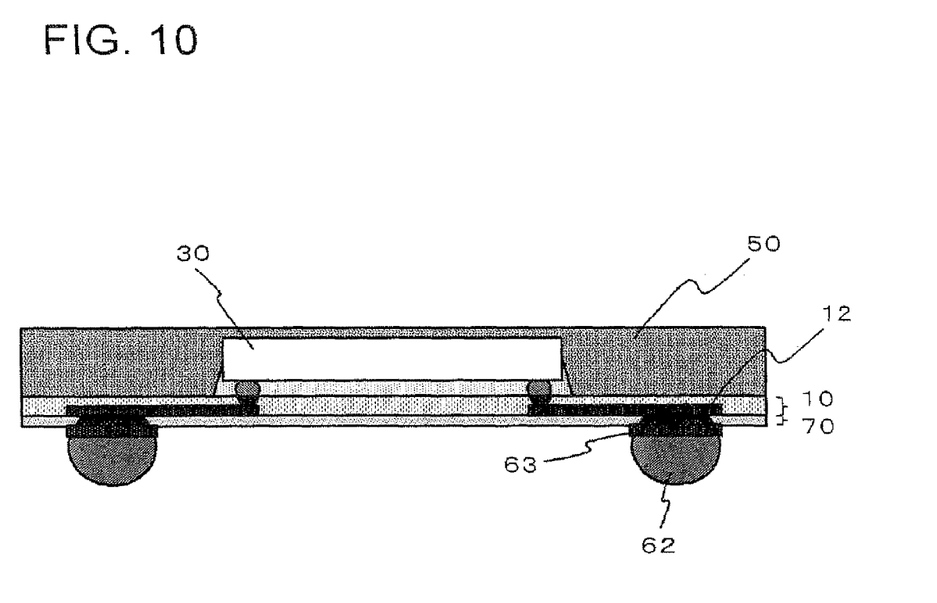
FIG. 10 is a schematic cross-sectional view showing a variation of the semiconductor device shown in FIG. 9.

In this embodiment, an UBM (Under Bump Metal) 63 may be provided as shown in FIG. 10. In FIG. 10, the UBM 63 is located between the conductor interconnect 12 and the solder ball 62. To be more detailed, the UBM 63 penetrates through the interconnect layer 70, thus to be connected to the conductor interconnect 12. Accordingly, a portion of the UBM 63 is buried in the interconnect layer 70, thus constituting the second conductive plug. Then, the solder ball 62 is formed on the UBM 63.

Figure 11:
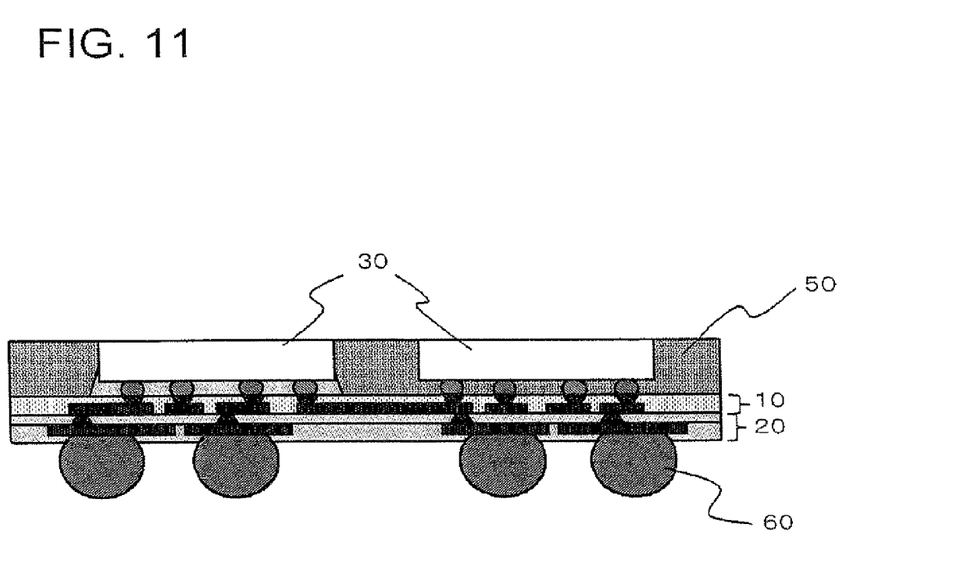
FIG. 11 is a schematic cross-sectional view showing a semiconductor device according to a variation of the embodiments.

The semiconductor device and the method of manufacturing the same according to the present invention are not limited to the foregoing embodiments, but may be modified in various manners. To cite a few examples, a plurality of IC chips 30 may be provided on the interconnect layer 10, as shown in FIG. 11.

Figure 12:
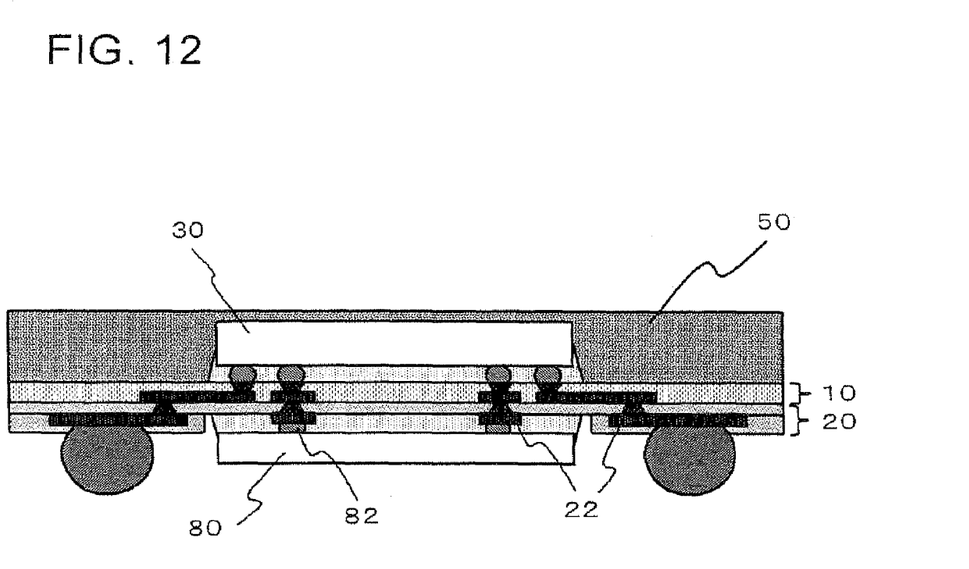
FIG. 12 is a schematic cross-sectional view showing a semiconductor device according to another variation of the embodiments.

Alternatively as shown in FIG. 12, in addition to the IC chip 30 provided as the first semiconductor chip on the interconnect layer 10, an IC chip 80 may be provided on the interconnect layer 20, as a second semiconductor chip. In FIG. 12, the IC chip 80 is mounted by flip-chip bonding on the interconnect layer 20 via solder balls 82 connected to the conductor interconnect 22.

Figure 13:
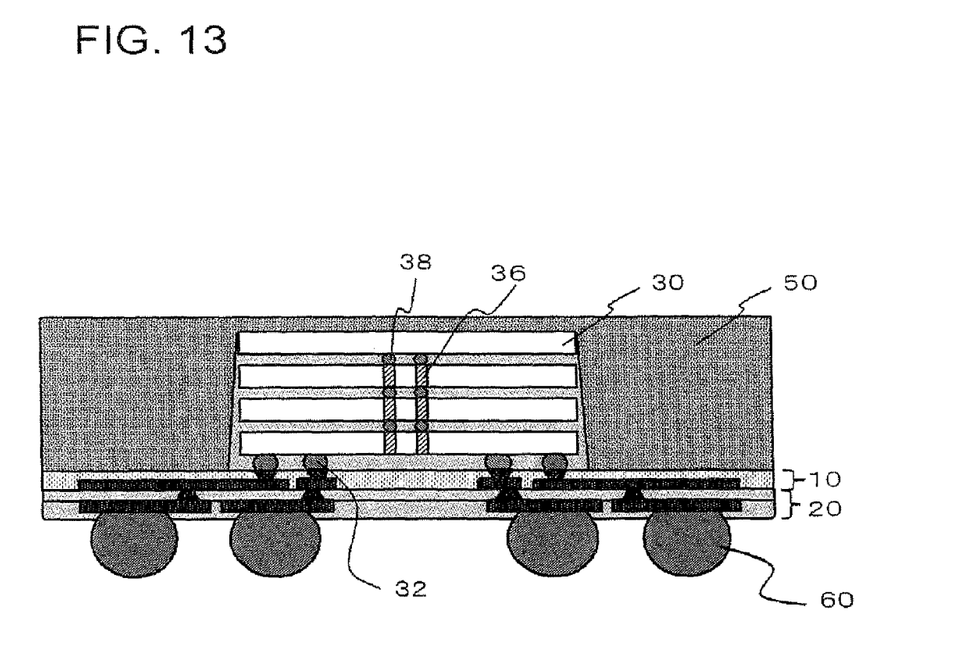
FIG. 13 is a schematic cross-sectional view showing a semiconductor device according to still another variation of the embodiments.

Also as shown in FIG. 13, a plurality of IC chips 30 may be stacked on the interconnect layer 10. In FIG. 13, the IC chips 30 are stacked in four levels. The lowermost IC chip 30 is bonded to the interconnect layer 10 via solder balls 32. Also, the respective IC chips 30 except the topmost one include via plugs 36. The via plug 36 are provided all the way through the respective IC chips 30. Further, the IC chips 30 are connected to one another via solder balls 38. In other words, the IC chips 30 are electrically connected to one another through the via plugs 36 and the solder balls 38.

Further, the structures of FIGS. 12 and 13 may be combined. Specifically, the IC chip 80 (Ref. FIG. 12) may be provided on the interconnect layer 20, with a plurality of IC chip 30 (Ref. FIG. 13) stacked on the interconnect layer 10.

In the foregoing embodiments, an electronic component other than the IC chip, such as a passive component, may be provided on the interconnect layers 10, 20, 70. Examples of the passive component include a capacitor, an inductor, a resistor and so forth.

The insulating resins 14, 24, 74 may be composed of a plurality of types of resins. In this case, the condition that the thermal decomposition temperature of the insulating resin 14 should be higher than that of the insulating resin 24 is synonymous to the condition that the thermal decomposition temperature of a resin having the lowest thermal decomposition temperature among those constituting the insulating resin 14 should be higher than that of a resin having the highest thermal decomposition temperature among those constituting the insulating resin 24.

It is apparent that the present invention is not limited to the above embodiment, and may be modified and changed without departing from the scope and spirit of the invention.

What is claimed is:

1. A semiconductor device comprising:
   a first interconnect layer including first interconnects;
   a semiconductor chip mounted on a first surface of said first interconnect layer;
   a second interconnect layer provided on a second surface of said first interconnect layer opposite to said first surface;
   plural first conductive plugs provided in said first interconnect layer, said first conductive plugs extending from respective ones of said first interconnects to said first surface of said first interconnect layer; and
   plural second conductive plugs provided in said second interconnect layer, said second conductive plugs extending from respective ones of said first interconnects to a surface of said second interconnect layer opposite to said first interconnect layer;
   wherein end faces of said first conductive plugs facing said second interconnect layer are smaller in area than the opposite end faces of said first conductive plugs;
   wherein end faces of said second conductive plugs facing said first interconnect layer are smaller in area than the opposite end faces of said second conductive plugs; and
   wherein a resin constituting said first interconnect layer has a higher thermal decomposition temperature than a resin constituting said second interconnect layer; and
   wherein a minimum interval between said first conductive plugs is narrower than a minimum interval between said second conductive plugs.

2. The semiconductor device according to claim 1,
   wherein said second interconnect layer includes second interconnects; and
   said second conductive plug extends from a respective one of said first interconnects to a respective one of said second interconnects.

3. The semiconductor device according to claim 1, further comprising a seal resin provided on said first interconnect layer so as to cover a side face of said semiconductor chip.

4. The semiconductor device according to claim 1,
   wherein said resin constituting said first interconnect layer is a polybenzooxazole or polyimide resin; and
   said resin constituting said second interconnect layer is an epoxy resin.

* * * * *